(12) United States Patent
Wagner

(10) Patent No.: US 8,932,888 B2
(45) Date of Patent: Jan. 13, 2015

(54) METHOD OF APPLYING A CONVERSION MEANS TO AN OPTOELECTRONIC SEMICONDUCTOR CHIP AND AN OPTOELECTRONIC COMPONENT

(75) Inventor: Ralph Wagner, Neutraubling (DE)

(73) Assignee: OSRAM Opto Semiconductors GmbH (DE)

( * ) Notice: Subject to any disclaimer, the term of this patent is extended or adjusted under 35 U.S.C. 154(b) by 88 days.

(21) Appl. No.: 13/821,614

(22) PCT Filed: Sep. 6, 2011

(86) PCT No.: PCT/EP2011/065401
§ 371 (c)(1),
(2), (4) Date: May 9, 2013

(87) PCT Pub. No.: WO2012/032052
PCT Pub. Date: Mar. 15, 2012

(65) Prior Publication Data
US 2013/0292724 A1  Nov. 7, 2013

(30) Foreign Application Priority Data
Sep. 10, 2010  (DE) .................. 10 2010 044 985

(51) Int. Cl.
*H01L 33/00* (2010.01)
*H01L 21/66* (2006.01)
*H01L 33/50* (2010.01)

(52) U.S. Cl.
CPC ............ *H01L 33/502* (2013.01); *H01L 33/505* (2013.01); *H01L 33/0095* (2013.01); *H01L 33/501* (2013.01); *H01L 33/508* (2013.01); *H01L 2933/0041* (2013.01)
USPC .......... 438/29; 257/E33.061; 257/98; 438/22; 438/23; 438/24; 438/25; 438/26; 438/27; 438/28; 438/30; 438/31; 438/32; 438/33; 438/34; 438/35; 438/36; 438/37; 438/38; 438/39; 438/40; 438/41; 438/42; 438/43; 438/44; 438/45; 438/46; 438/47

(58) Field of Classification Search
None
See application file for complete search history.

(56) References Cited

U.S. PATENT DOCUMENTS 6,114,088 A     9/2000  Wolk et al.
6,214,520 B1 *  4/2001  Wolk et al. ............... 430/273.1
(Continued)

FOREIGN PATENT DOCUMENTS

EP    2 157 053 A1    7/2009
JP    2005-19874      1/2005
(Continued)

OTHER PUBLICATIONS

Japanese Examination Report dispatched Feb. 3, 2014 from corresponding Japanese Patent Application No. 2013-527578 (English translation only—6 pages).

*Primary Examiner* — Steven Loke
*Assistant Examiner* — Juanita B Rhodes
(74) *Attorney, Agent, or Firm* — DLA Piper LLP (US)

(57) ABSTRACT

A method of applying a conversion means to an optoelectronic semiconductor chip includes preparing the optoelectronic semiconductor chip having a main radiation face, preparing the conversion means, the conversion means being applied to a main carrier face of a carrier, arranging the conversion means such that it faces the main radiation face and has a spacing relative to the main radiation face, and releasing the conversion means from the carrier and applying the conversion means to the main radiation face by irradiation and heating of an absorber constituent of the conversion means and/or of a release layer located between the conversion means and the carrier with a pulsed laser radiation which passes through the carrier.

12 Claims, 4 Drawing Sheets

(56) References Cited

U.S. PATENT DOCUMENTS

| | | | |
|---|---|---|---|
| 2004/0180789 A1* | 9/2004 | Yamamoto et al. | 503/201 |
| 2005/0147849 A1* | 7/2005 | Wolk | 428/690 |
| 2006/0040200 A1* | 2/2006 | Song et al. | 430/199 |
| 2006/0258028 A1 | 11/2006 | Paolini et al. | |
| 2007/0004065 A1 | 1/2007 | Schardt et al. | |
| 2007/0221867 A1* | 9/2007 | Beeson et al. | 250/487.1 |
| 2008/0231170 A1* | 9/2008 | Masato et al. | 313/501 |
| 2009/0091239 A1 | 4/2009 | Cho et al. | |
| 2009/0321758 A1* | 12/2009 | Liu et al. | 257/98 |

FOREIGN PATENT DOCUMENTS

| | | |
|---|---|---|
| JP | 2009-54891 | 3/2009 |
| WO | 2005/051044 A1 | 6/2005 |
| WO | 2006/111510 A2 | 10/2006 |
| WO | 2009/045924 | 4/2009 |
| WO | 2010/019887 | 2/2010 |

* cited by examiner

FIG 1
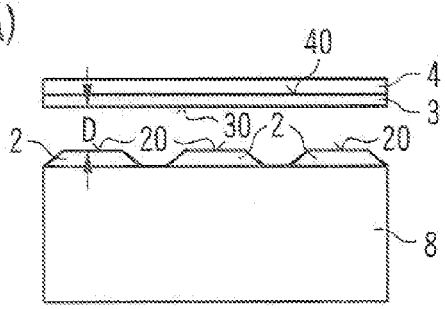
A)
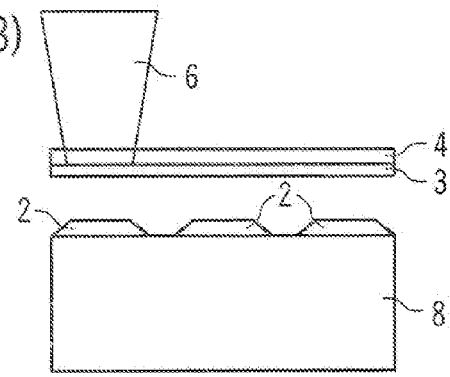
B)
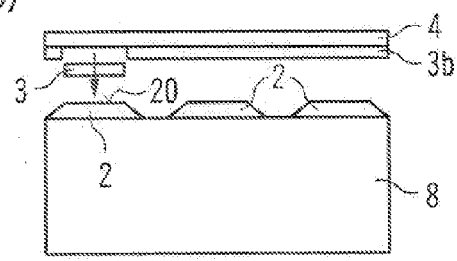
C)
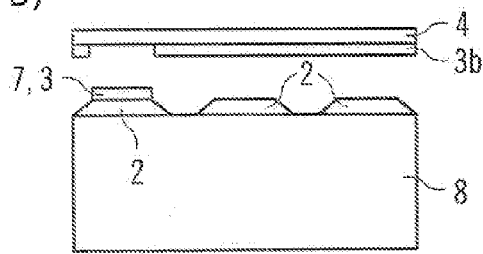
D)
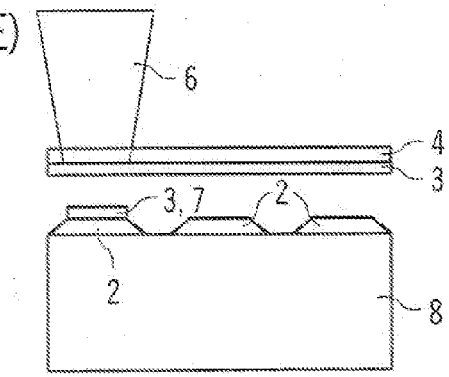
E)
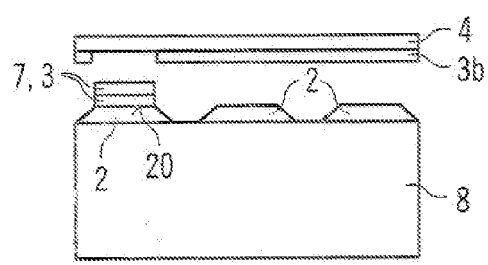
F)
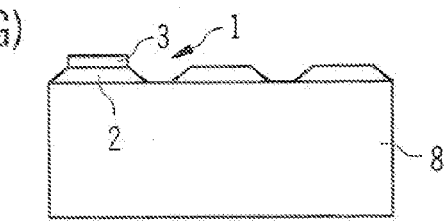
G)

FIG 2
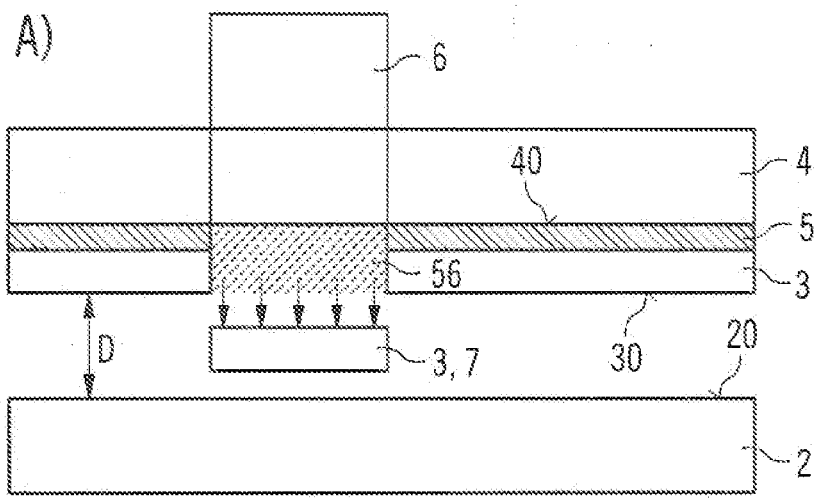
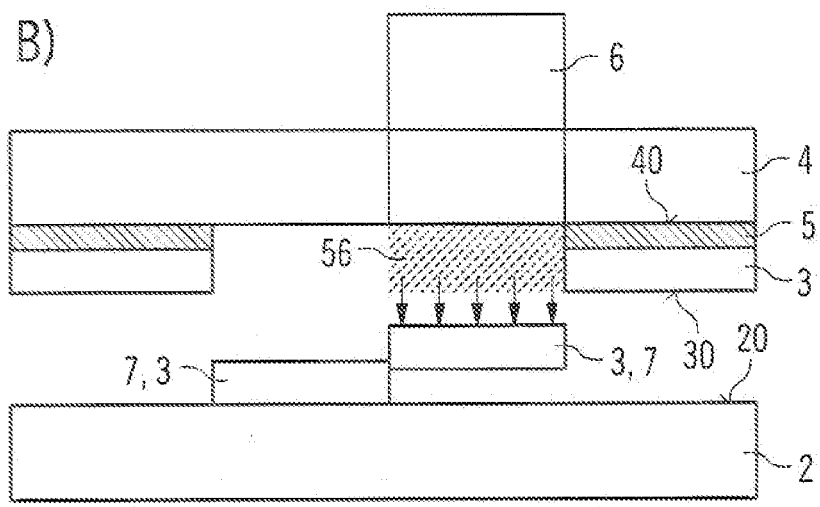
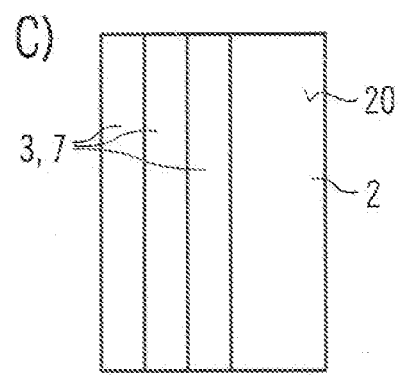

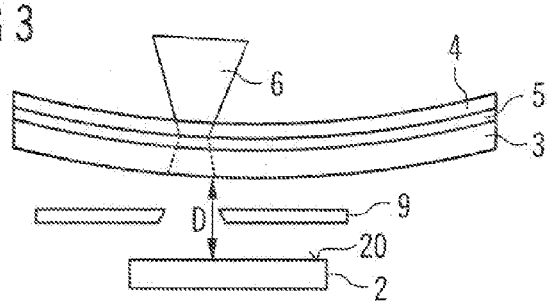
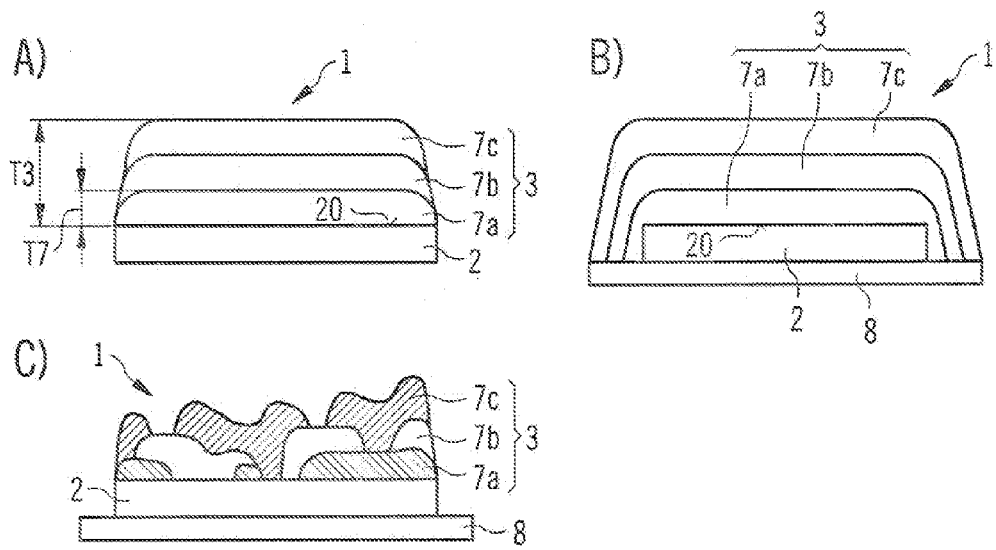
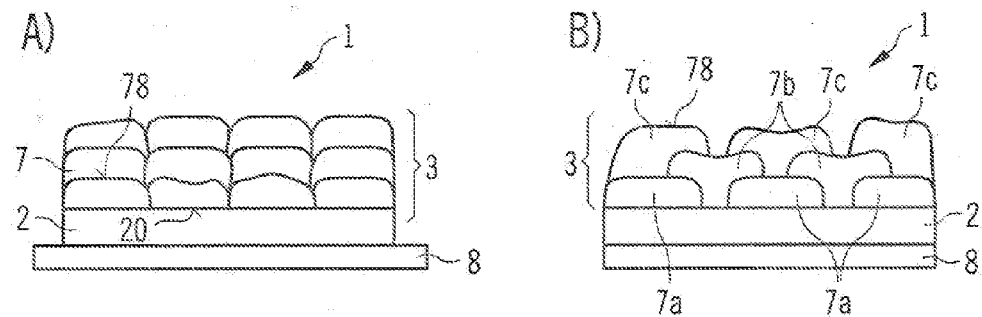

METHOD OF APPLYING A CONVERSION MEANS TO AN OPTOELECTRONIC SEMICONDUCTOR CHIP AND AN OPTOELECTRONIC COMPONENT

RELATED APPLICATIONS

This is a §371 of International Application No. PCT/EP2011/065401, with an international filing date of Sep. 6, 2011 (WO 2012/032052 A1, published Mar. 15, 2012), which is based on German Patent Application No. 10 2010 044 985.7 filed Sep. 10, 2010, the subject matter of which is incorporated herein by reference.

TECHNICAL FIELD

This disclosure relates to a method of applying a conversion means to an optoelectronic semiconductor chip of an optoelectronic component and a corresponding optoelectronic component.

BACKGROUND

There is a need for a method with which a conversion means can be applied to an optoelectronic semiconductor chip in a total thickness corresponding to a predeterminable color location, and to define an optoelectronic component produced therewith.

SUMMARY

We provide a method of applying a conversion means to an optoelectronic semiconductor chip including preparing the optoelectronic semiconductor chip having a main radiation face, preparing the conversion means, the conversion means being applied to a main carrier face of a carrier, arranging the conversion means such that it faces the main radiation face and has a spacing relative to the main radiation face, and releasing the conversion means from the carrier and applying the conversion means to the main radiation face by irradiation and heating of an absorber constituent of the conversion means and/or of a release layer located between the conversion means and the carrier with a pulsed laser radiation which passes through the carrier.

We also provide an optoelectronic component including an optoelectronic semiconductor chip having a main radiation face, a conversion means applied to the main radiation face in at least two successive and at least partially overlapping plies of the same kind, and an additional constituent in the conversion means, which does not absorb a radiation generated during operation of the semiconductor chip, wherein, in a direction away from the main radiation face, a concentration of the additional constituent in boundary regions of two adjacent plies is in each case different in comparison with core regions of the plies.

We further provide a method of applying a conversion means to an optoelectronic semiconductor chip, including preparing the optoelectronic semiconductor chip having a main radiation face, preparing the conversion means, the conversion means applied to a main carrier face of a carrier, arranging the conversion means such that it faces the main radiation face and has a spacing relative to the main radiation face, and releasing the conversion means from the carrier and applying the conversion means to the main radiation face by irradiation and heating with a pulsed laser radiation of an absorber constituent of the conversion means and/or of a release layer located between the conversion means and the carrier, wherein 1) said release layer is completely or virtually completely decomposed by the pulsed laser radiation, 2) the pulsed laser radiation passes through the carrier, 3) the release layer and/or the absorber constituent of the conversion means can be thermally or photochemically decomposed by the pulsed laser radiation, and 4) the pulsed laser radiation is completely or virtually completely absorbed in a thin region close to the main carrier face, that region having a thickness of 20 nm to 200 nm, and/or optical density of the release layer is at least 2.0.

BRIEF DESCRIPTION OF THE DRAWINGS

FIGS. 1A-1F, 2A-2C and 3 show diagrammatic views of examples of methods described herein for the production of optoelectronic components.

FIGS. 4A-4C to 5A-5B show diagrammatic sectional views of examples of optoelectronic components.

DETAILED DESCRIPTION

Figure 6:
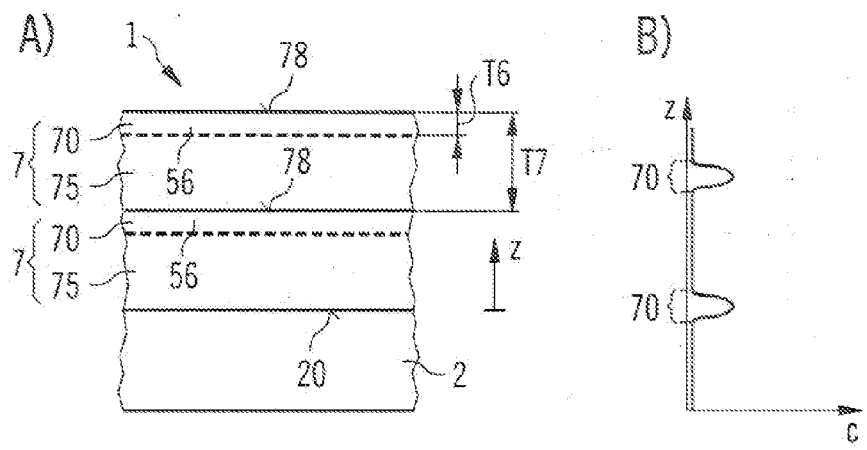
FIGS. 6A-6B, 7 and 8A-8C show diagrammatic representations of the concentration curves of an additional constituent in a conversion means of optoelectronic components.

My method may apply a conversion means to an optoelectronic semiconductor chip. The conversion means comprises a conversion material arranged to convert some or all of radiation emitted by the optoelectronic semiconductor chip into radiation of a different wavelength. For example, the conversion means has a matrix material in which the conversion material is embedded. The matrix material is preferably a polymer or at least one starting material of a polymer. The conversion material comprises or consists especially of a garnet doped with rare earths such as Ce:YAG or Eu:YAG. The semiconductor chip is preferably a light-emitting diode.

The method may comprise preparing the optoelectronic semiconductor chip, the semiconductor chip having a main radiation face. The main radiation face is a boundary surface of the semiconductor chip by means of which radiation generated in the semiconductor chip predominantly leaves the semiconductor chip. "Predominantly" means especially a proportion of more than 50% or of more than 75%. The main radiation face is preferably oriented perpendicularly to a direction of growth of the semiconductor chip which is, for example, produced epitaxially. The semiconductor chip can be mounted on a chip substrate, it being possible for the chip substrate to be a growth substrate of the semiconductor chip or a carrier substrate different from the growth substrate. The main radiation face preferably faces away from the chip substrate.

The method may comprise preparing the conversion means. The conversion means may be applied in at least one layer at least indirectly to a main carrier face of a carrier. The carrier can be of mechanically flexible or mechanically rigid construction. The carrier is transparent in at least one spectral sub-range in the ultraviolet and/or the visible range.

The method may comprise arranging the conversion means. The conversion means on the carrier may be so arranged that it faces the main radiation face of the semiconductor chip. In other words, the layer of the conversion means may be located between the main radiation face and the carrier. A region between the conversion means and the main radiation face can be evacuated or filled with a gas. Preferably, the layer of the conversion means is so aligned that a main face of the conversion means that faces the main radiation face is oriented parallel to the main radiation face of the semiconductor chip. Preferably a normal vector of the main radiation face points vertically upwards and of the main face of the conversion means points vertically downwards, for example, with a tolerance of at most 15°. "Vertically upwards" means in a direction opposite to gravitational force and "downwards" means in the direction of gravitational force.

The method may include releasing the conversion means from the carrier. Release may be effected by heating an absorber constituent of the conversion means and/or by heating a release layer located between the conversion means and the carrier. As a result of the heating, the absorber constituent or regions of the conversion means immediately surrounding the absorber constituent or a release material of the absorber layer at least partly enter(s) into the gaseous phase. The material entering into the gaseous phase is located close to the carrier and accordingly on a side of the conversion means facing away from the main radiation face of the semiconductor chin. The transition into the gaseous phase results in an increase in volume, with the result that the conversion means is released from the carrier. The release takes place especially directed in a direction perpendicular to the main carrier face, for example, with a tolerance of at most 30° or with a tolerance of at most 15°. As a result of the directed release, the conversion means is applied to the main radiation face.

The absorber constituent of the conversion means may be different from the conversion material. In particular, the absorber constituent of the conversion means may not effect a wavelength conversion. Preferably, the absorber constituent absorbs none or substantially none of the radiation generated by the semiconductor chip and/or by the conversion means during operation.

The release and application of the conversion means may be effected with a pulsed laser radiation. The laser radiation passes through the carrier which is transparent to the laser radiation. "Transparent" means that the carrier absorbs, for example, less than 10% or less than 1% of the laser radiation. The laser radiation is absorbed by the absorber constituent or by the release layer with the result that heating of the absorber constituent or of the release layer takes place. The laser radiation preferably has a wavelength smaller than a wavelength of the radiation emitted by the semiconductor chip during operation.

During the release and application of the conversion means the main radiation face may be spaced apart from the main face of the conversion means. In other words, the conversion means and the main radiation face need not touch.

The method may apply a conversion means to an optoelectronic semiconductor chip. The method may comprise at least the following steps, especially in the order indicated:
 preparation of the optoelectronic semiconductor chip having a main radiation face,
 preparation of the conversion means, the conversion means being applied to a main carrier face of a carrier,
 arrangement of the conversion means such that it faces the main radiation face and has a spacing >0 relative to the main radiation face, and
 release of the conversion means from the carrier and application to the main radiation face by irradiation and heating of an absorber constituent of the conversion means and/or of a release layer located between the conversion means and the carrier with a pulsed laser radiation which passes through the carrier.

By such a method, the conversion means can be applied layer by layer in a plurality of successive plies to the main radiation face of the semiconductor chip. The thickness of the conversion means to be applied to the semiconductor chip can be adjusted by the number of plies, with the result that also a color location of the radiation generated by the semiconductor chip together with the conversion means during operation can be purposively adjusted.

The conversion means may have as matrix material a silicone, an epoxide and/or a silicone-epoxide hybrid material or consists thereof. The conversion material, which is preferably particulate, is embedded in the matrix material.

The matrix material of the conversion means on the carrier may be in incompletely crosslinked and/or incompletely cured form. In other words, the hardness of the matrix material on the carrier can be increased, for example, by illumination or heat. Full curing and/or crosslinking of the matrix material takes place furthermore only after application to the semiconductor chip. Because the matrix material is applied to the semiconductor chip in incompletely crosslinked and/or cured form, it is possible to effect mechanically reliable joining of the conversion means to the semiconductor chip and of the plies of the conversion means on the semiconductor chip to one another.

The conversion means may be applied to the semiconductor chip in succession in a plurality of successive plies. The individual plies applied to the semiconductor chip can have a thickness corresponding to a layer thickness of the layer of the conversion means on the carrier, for example, with a tolerance of at most 30% or with a tolerance of at most 15%. It is possible for a small portion of the conversion means to remain on the carrier on release. Each of the plies therefore represents a separated sub-region of the layer of the conversion means on the carrier. In boundary regions between adjacent plies, in particular the absorber constituent or the absorber material from the release layer has a different concentration in comparison with central regions of the individual plies.

Once at least one of the plies has been applied a color location of the radiation emitted by the semiconductor chip together with the conversion means already applied to the semiconductor chip may be determined. This may be effected, for example, by intermittent electrical operation of the semiconductor chip or excitation of the conversion means already applied with an external light source.

In dependence upon the color location determined one or more plies of the conversion means may be applied to the semiconductor chip. As a result, variations in the concentration of the conversion material in the layer of the conversion means on the carrier or variations in the thickness of the layer of the conversion means can be balanced out and a color location of the finished semiconductor component can be adjusted with high precision.

The release layer between the carrier and the layer of the conversion means on the carrier may comprise the release material which, on release of the conversion means, enters at least partly into a gaseous phase as a result of the laser radiation. Furthermore, the release material that has entered into the gaseous phase may be deposited at least partly on the conversion means on the semiconductor chip and/or become embedded in the conversion means on the semiconductor chip. In other words, the release material from the release layer may become a constituent of the conversion means on the semiconductor chip. In particular, the release material may become embedded in boundary regions between two successive plies of the conversion means on the semiconductor chip.

The laser radiation may have a wavelength of at most 410 nm, especially of at most 370 nm, and may lie in the ultraviolet spectral range. The wavelength of the laser radiation is especially at least 220 nm. The release layer and/or the release material of the release layer and/or the absorber constituent of the conversion means exhibit absorption at the wavelength of the laser radiation. The release layer or the absorber constituent of the conversion means can be heated or thermally or photochemically decomposed by the laser radiation.

The release layer between the carrier and the conversion means may comprise a plastics or a polymer, or consists thereof. In particular, the release layer may comprise or consist of ZnO. ZnO exhibits absorption at wavelengths below about 365 nm to 387 nm. Decomposition of ZnO can accordingly be affected by a frequency-tripled Nd:YAG laser at 355 nm. On decomposition of the ZnO, there is formed especially metallic zinc which can become finely divided on decomposition. Exposed to atmospheric oxygen, this zinc is able to oxidise to ZnO and becomes transparent or translucent again. It is likewise possible for the zinc to react with a constituent of the conversion means, for example, with a silicone. In addition, ZnO can be deposited in thin layers on the carrier by physical or chemical gas phase deposition, abbreviated as PVD or CVD, respectively.

The release layer may have a thickness of 10 nm to 75 nm, especially 20 nm to 50 nm. An optical density of the release layer for the laser radiation is at least 0.5 or at least 0.65. In particular, the optical density of the release layer is 0.75 to 1.0 or 1.50 to 4.0. Alternatively or in addition, the optical density of the release layer is at least 2.0.

In other words, in one case the release layer is able to transmit a comparatively large portion of the laser radiation. As a result, complete or virtually complete dissolution or vaporization of the release layer is achieved. As an alternative thereto, it is possible for the release layer to absorb all or substantially all of the laser radiation so that no laser radiation or substantially no laser radiation reaches the conversion means. As a result, the conversion means and specifically the conversion material can be protected from the laser radiation in which case sub-regions of the release layer can remain on the conversion means that has been applied to the semiconductor chip.

A region of the conversion means irradiated by the laser radiation on the main carrier face may be linear in shape. A quotient from a length and a width of the laser radiation on the conversion means, seen in plan view onto the main carrier face, is, for example, at least 5 or at least 10 or at least 20.

The conversion means may be applied line by line to the main radiation face. The conversion means on the main radiation face is accordingly preferably formed by a plurality of individual, successively applied strips.

The region irradiated by the laser radiation on the main carrier face may have the shape of the main radiation face of the semiconductor chip with a tolerance of at most 25% or at most 10% of the lateral extents of the semiconductor chip. The irradiated region and the main radiation face are therefore approximately congruent. As a result it is possible, by a single pulse of laser radiation to cover the entire main radiation face with a single ply, especially a continuous ply, of the conversion means.

There is further defined an optoelectronic component having an optoelectronic semiconductor chip and a conversion means applied thereto. For example, the component is produced by a method as described in conjunction with one or more of the above-mentioned examples. Features of the optoelectronic component are therefore also disclosed for the method described herein and vice versa.

In the optoelectronic component, the conversion means may have an additional constituent which does not exhibit absorption with respect to radiation generated during operation of the semiconductor chip. The additional constituent is especially the absorber constituent and/or the absorber material. The additional constituent exhibits absorption in at least a wavelength range of 220 nm to 410 nm and transmits radiation and/or is reflective especially in a wavelength range of 420 nm to 490 nm, in which the semiconductor chip preferably generates radiation during operation.

The component may have at least two successive and at least partially overlapping plies, preferably of the same kind, on the main radiation face. "Overlapping" means that at least two of the plies of the conversion means lie one on top of the other in a direction perpendicular to the main radiation tine. The plies are preferably in immediate, direct contact with one another. The fact that the plies are of the same kind can mean that the conversion means in the plies has the same average composition in each case.

A concentration of the additional constituent in the boundary regions between two adjacent plies may in each case be different in comparison with core regions of the plies. Within the core regions, the concentration of the additional constituent may in each case be approximately constant. The boundary regions may have a smaller average thickness than the core regions, for example, an average thickness that is smaller by at least a factor of 2 or by at least a factor of 5 or by at least a factor of 15. In other words, adjacent plies may be demarcated front one another by a change in the concentration of the additional constituent. In a section through the plies perpendicular to the main radiation face, a concentration profile of the additional constituent can recur periodically, the length of a period preferably being given by a thickness of the plies.

The optoelectronic component may comprise an optoelectronic semiconductor chip having a main radiation face. Furthermore, the component may contain a conversion means applied to the main radiation face in at least two successive and at least partially overlapping plies of the same kind. The conversion means may have an additional constituent which does not absorb radiation generated during operation of the semiconductor chip. Seen in a direction away from the main radiation face, in each of the boundary regions of two adjacent plies the concentration of the additional constituent may be different in comparison with core regions of the plies.

The individual plies may each have an average thickness of at least 1 μm or of at least 2 μm. Alternatively or in addition, the average thickness of the plies is at most 15 μm or at most 10 μm or at most 8 μm or at most 6 μm.

The conversion means, which may comprise a plurality of plies, on the main radiation face may have an average thickness of in total at least 15 μm or at least 40 μm. Alternatively or in addition, the average thickness of the conversion means may be at most 200 μm or at most 150 μm or at most 100 μm.

The boundary regions between the adjacent plies may have an average thickness of 10 nm to 500 nm, especially 15 nm to 250 nm or 20 nm to 100 nm. The boundary regions of the plies are therefore comparatively thin in comparison with the core regions of the plies.

In the boundary regions, a concentration of the additional constituent may be increased relative to the core regions. Alternatively, it is possible for the concentration of the additional constituent in the core regions to be reduced.

In the boundary regions, the concentration of the additional constituent in a direction away from the main radiation the may exhibit a sigmoidal curve. In the boundary regions, therefore, the concentration of the additional constituent may first decrease and then increase again or vice versa.

At least two of the plies of the conversion means may overlap both in the lateral direction and in a direction perpendicular to the main radiation face. At least one of the plies can have a convexly curved boundary face facing away from the main radiation face. In other words, at least one of the plies may be shaped similarly to a converging lens on a boundary face facing away from the main radiation face.

An optoelectronic component described herein and a method described herein will be explained in detail below on the basis of examples and with reference to the drawings. In the individual Figures, elements that are identical are denoted by identical reference numerals, but are not shown to scale; rather the size of individual elements may have been shown exaggerated for the purpose of better understanding.

FIG. 1 shows diagrammatic sectional views of an example of a method for production of an optoelectronic component 1. In accordance with FIG. 1A, a chip substrate 8 having a plurality of optoelectronic semiconductor chips 2 located thereon, especially light-emitting diodes that emit in the blue spectral range during operation, is prepared. Furthermore, a mechanically rigid carrier 4 having a main carrier face 40 is prepared. Electrical connecting means of the carrier 4 are not shown in the Figures. On the main carrier face 40 there is a layer of a conversion means 3. A main face 30 of the conversion means faces towards the main radiation faces 20 of the semiconductor chips 2. A spacing D between the conversion means 3 and the semiconductor chips 2 is especially 1 μm to 500 μm, preferably 2 μm to 50 μm or 5 μm to 50 μm. A space between the conversion means 3 and the semiconductor chips 2 can be filled with a was such as nitrogen or air or can also be evacuated.

In accordance with FIG. 1B, a region of the conversion means 3 is irradiated with a laser radiation 6. The laser radiation 6 is a pulsed laser radiation especially having pulses of a duration, of at most 50 ns or of at most 10 ns. The laser radiation 6 passes through the carrier 4 which is transparent to the laser radiation 6. An absorber constituent, not shown in FIG. 1, which is enclosed by the conversion means 3, is heated by the laser radiation 6. As a result of the absorption of the laser radiation 6, by the absorber constituent some of the conversion means 3 therefore enters into the gaseous phase, with the result that the irradiated region of the conversion means 3 becomes detached from the carrier 4.

The carrier 4 is, for example, a mechanically rigid plate made of quartz glass. The laser radiation 6 is generated especially by an excimer laser and can have a wavelength of about 248 nm. An energy density of the laser radiation 6 is, for example, 0.2 J/cm$^2$ to 5 J/cm$^2$. The irradiated region of the conversion means 3 has the contour of the main radiation face 20 of the semiconductor chip 2. As shown in FIG. 1C, a portion of the layer of the conversion means 3 on the carrier 4 becomes detached therefrom and is applied directly to the main radiation face 20 where it forms a ply 7 of the conversion means as shown in FIG. 1D.

In accordance with FIGS. 1E and 1F, a further ply 7 of the conversion means 3 is applied to the semiconductor chip 2. The two plies 7 are in direct contact with one another and, seen in plan view onto the main radiation face 20, overlap one another. The ply 7 applied in accordance with FIGS. 1E and 1F is especially the same conversion means 3 as that applied in accordance with FIGS. 1A to 1D. Alternatively, it is also possible for it to be a different conversion means that is arranged, for example, to emit radiation in a different wavelength range.

Between applications of the two plies 7, the semiconductor chip 2 can optionally be operated for a brief period to ascertain a color location of the radiation emitted during operation. With reference to the color location ascertained it is possible in particular to determine a number of further plies to be applied.

The conversion means 3 on the carrier 4 preferably comprises a matrix material such as a silicone which, on the carrier 4 and during application to the semiconductor chip 2, is in the still incompletely cured and/or crosslinked state. In accordance with FIG. 10, the conversion means 3 applied to the semiconductor chip 2, that is to say all plies 7 together, is fully crosslinked or cured. The full crosslinking and/or curing is accordingly effected only when all the plies 7 of the conversion means 3 on the semiconductor chip 2 have been applied so that the plies 7 are also joined to one another and to the semiconductor chip 2. Curing and/or crosslinking can be effected by the action of heat, irradiation or contact with a gaseous hardener.

Differently from what is shown, it is possible for only one of the semiconductor chips 2 to he mounted on the carrier 8 or for the plurality of semiconductor chips 2 to directly abut one another in the lateral direction. Optionally, the chip substrate 8 can be separated into parts each having a semiconductor chip 2.

In the example in accordance with FIG. 2, a release layer 5 is located between the conversion means 3 and the carrier 4. The release layer 5 absorbs the laser radiation 6. A release material 56 from the release layer 5 enters partly or completely into the gaseous phase. As a result of the increase in volume resulting therefrom, a portion of the conversion means 3 is released from the release layer 5 and from the carrier 4 and moves in the direction towards the main radiation face 20 of the semiconductor chip 2.

The laser radiation 6, seen in plan view onto the earner 4, illuminates a strip of the conversion means 3 as shown in accordance with FIG. 2C. The individual plies 7 are in the form of strips. Furthermore, the individual plies 7 are applied to the main radiation face 20 chronologically one after the other and physically one next to the other as shown in FIG. 2B. Release of the conversion means 3 from the carrier 4 in individual strips can also take place in the method according to FIG. 1 without the use of a release layer.

Differently from what is shown in FIGS. 1 and 2, in the example of the method in accordance with FIG. 3, the carrier 4 is a flexible carrier, for example, a plastics film transparent to the laser radiation 6. The laser radiation 6 is generated, for example, with a YAG laser and has a wavelength of about 355 nm, it being possible for the carrier 4 to have a curved surface facing the semiconductor chip 2. The spacing D between the conversion means 3 and the semiconductor chip 2 can therefore vary over the carrier 4.

Optionally, a mask 9 is applied between the conversion means 3 and the semiconductor chip 2. With the mask 9, which has an opening for the region of the conversion means 3 released by the laser radiation 6, it is possible to capture a portion of the release material of the release layer 5 that has entered into the gaseous phase and prevent such portions of the release material from reaching the semiconductor chip 2 and becoming embedded in the conversion means 3 on the semiconductor chip 2.

FIGS. 4A to 4C show sectional views of examples of the optoelectronic component 1. In accordance with FIG. 4A, there are applied to the main radiation face 20 a plurality of plies 7a, 7b, 7c which lie approximately congruently one on top of the other and form the conversion means 3 on the semiconductor chip 2. A thickness 17 of the individual plies 7a, 7b, 7c is, for example, 2 μm to 5 μm. A total thickness T3 of the conversion means 3 is, for example, 15 μm to 200 μm. The number of plies 7a, 7b, 7c is shown only diagrammatically in FIG. 4. For example, the conversion means 3 on the main radiation face 20 comprises two plies to 50 plies, especially three plies to 25 plies or ten plies to 25 plies.

In the example of the component 1 in accordance with FIG. 4B, the plies 7a, 7b, 7c extend both over the main radiation face 20 and over lateral boundary surfaces of the semiconductor chip 2. The semiconductor chip 2 is therefore entirely or substantially entirely enclosed by the chip substrate 8 and the conversion means 3. The plies 7a, 7b, 7c in accordance with FIGS. 4A and 4B are each continuous plies which extend over the entire main radiation face 20. FIG. 4C, however, shows that the individual plies 7a, 7b, 7c can be of non-continuous construction and can pass through and/or overlap one another. Such a construction of the plies can be the case when an irradiated region of the conversion means 3 on the carrier 4 becomes fragmented on the way from the carrier 4 to the main radiation face 20 and does not strike the main radiation face 20 as a continuous layer or decomposes into several pieces on striking the main radiation face 20.

FIGS. 5A and 5B show examples of the component 1 in which the individual plies 7 have been applied in the form of strips as shown in FIG. 2C. In accordance with FIG. 5A, the individual plies 7 overlap only very slightly in the lateral direction and are stacked regularly one on top of the other in the direction perpendicular to the main radiation face 20. At least some of the plies 7 have a convex shape on the boundary faces 78 thereof facing away from the semi-conductor chip 2.

In accordance with FIG. 5B, the strip-like plies 7a, 7b, 7c are staggered laterally relative to one another. For example, the plies 7a located in one layer are spaced apart laterally from one another. Gaps between the plies 7a are closed by the plies 7b, gaps between the plies 7b are closed by the plies 7c and so on.

FIG. 6A illustrates a further example of the component 1 and FIG. 7B shows a curve of the concentration c of the release material 56 front the release layer 5. The component 1 in accordance with FIG. 6A has been produced using a method in accordance with FIG. 2 using a release layer 5. In boundary regions 70 having a thickness T6, the concentration c of the release material 56 from the release layer 5 or of a decomposition product, resulting from the laser radiation 6, from the release layer 5 is increased. Central regions 75 contain no or substantially no release material 56. The individual plies 7 therefore each exhibit a comparable curve of the concentration c of the release material 56. The concentration curve c along a direction z perpendicular to the main radiation face 20 is therefore periodic with a period length corresponding to the thickness T7 of the plies 7. A thickness T7 of the plies in total is significantly greater than a thickness T6 of the boundary regions 70 alone.

Figure 7:
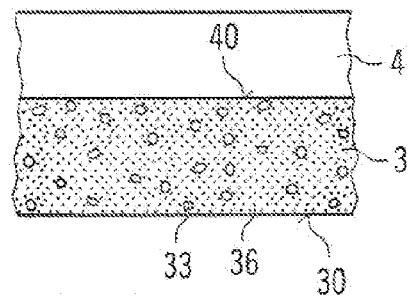

FIG. 7 shows the conversion means 3 directly on the carrier 4 in a method approximately in accordance with FIG. 1 without a release layer. The conversion means 3 has a matrix material in which particles 33 of conversion material and particles of the absorber constituent 36 are uniformly distributed. The absorber constituent 36 has an absorption coefficient for radiation generated in the semiconductor chip 2 during operation of preferably at most 20% or 10% or 5%. Such an absorber constituent 36 can optionally also be added to the conversion means 3 in a method as in FIG. 2 with a release layer to protect the particles 33 of conversion material from the laser radiation 6.

The particles 33 of conversion material are, for example, Ce:YAG particles having a diameter of 1 μm to 5 μm or nanoparticles having diameters of 1 nm to 100 nm formed, for example, with or without zinc selenide.

The absorber constituent 36 is preferably present in a relatively high particle density. Preferably, as a result of the absorber constituent 36, the conversion means 3 has an optical density for the laser radiation 6 sufficiently high for the laser radiation 6 to be completely or virtually completely absorbed in a thin region close to the main carrier face 40.

That region has a thickness of, for example, 20 nm to 200 nm. The laser radiation 6 is thereby efficiently kept away from the particles 33 of conversion material.

As also in all the other examples, the absorber constituent 36 comprises, for example, zinc oxide or, in abbreviated form, ZnO, having a band gab in the range of approximately from 3.2 eV to 3.4 eV, or consists thereof. If the absorber constituent 36 is particulate, the particles preferably have an average diameter of at most 100 nm, especially 5 nm to 20 nm. A proportion by weight of the absorber constituent 36 in the conversion means 3 is preferably 5% by weight to 35% by weight, especially 10% by weight to 20% by weight.

Figure 8:
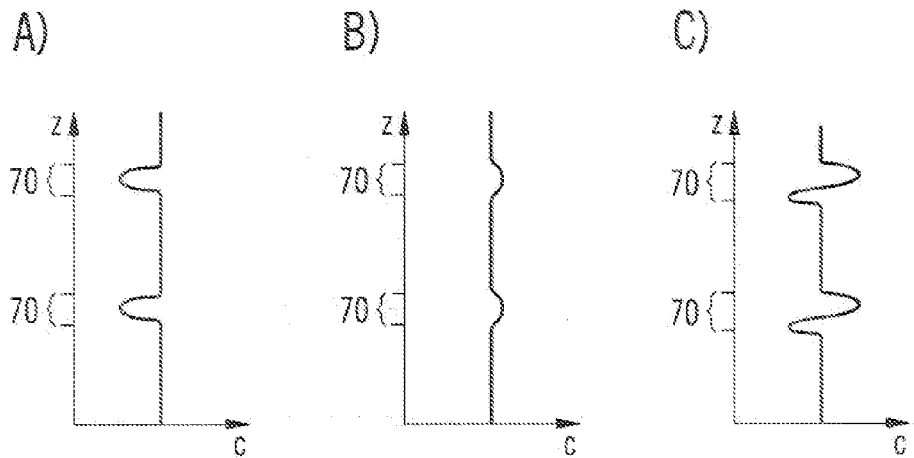

FIG. 8 shows further curves of the concentration c of the additional constituent along the z direction away from the main radiation face 20. All concentration curves exhibit recurring periodic behaviour for each of the plies, see also FIG. 6B. The concentration curves shown in FIG. 8 can occur in particular in a method in accordance with FIG. 1 without the use of an absorber layer as shown in FIG. 7.

In accordance with FIG. 8A, the concentration c of the additional constituent decreases in each of the boundary regions 70. The decrease can be caused by the absorber constituent 36 being decomposed by the laser radiation or entering into the gaseous phase to a greater extent than the matrix material of the conversion means 3.

In accordance with FIG. 8B, the concentration c of the absorber constituent 36 is increased in the boundary regions 70. This can occur in particular in a case where the absorber constituent 36 absorbs the laser radiation 6, is converted into heat and transmits that heat to the matrix material. Then substantially the matrix material vaporizes and the absorber constituent 36 does not vaporize or vaporizes only to a lesser extent. On transfer of the conversion means 3 to the semiconductor chip 2, a portion of the matrix material of the conversion means 3 can therefore be lost.

In accordance with the FIG. 8C, the concentration c of the absorber constituent 36 in the boundary regions 70 exhibits a sigmoidal curve. Such a curve occurs, for example, in a case where the absorber constituent 36 is vaporized to a comparatively great extent on release from the carrier 4 and accordingly a comparatively large portion thereof disappears from the layer of the conversion means 3 and is then deposited on the conversion means 3 again.

The methods and component described herein are not limited by the description on the basis of the examples. Rather, this disclosure encompasses any novel feature and any combination of features, including in particular any combination of features in the appended claims, even if those features or combinations are not themselves explicitly defined in the claims or examples.

The invention claimed is:

1. A method of applying a conversion means to an optoelectronic semiconductor chip comprising:
preparing the optoelectronic semiconductor chip having a main radiation face,
preparing the conversion means, the conversion means being applied to a main carrier face of a carrier,
arranging the conversion means such that it faces the main radiation face and has a spacing relative to the main radiation face, and
releasing the conversion means from the carrier and applying the conversion means to the main radiation face by irradiation and heating of an additional constituent of the conversion means with a pulsed laser radiation which passes through the carrier, wherein the conversion means is applied to the main radiation face in at least two successive and at least partially overlapping plies of the same kind, in a direction away from the main radiation face, a concentration of the additional constituent in boundary regions of two adjacent plies is in each case different in comparison with core regions of the plies, and the additional constituent is present at least in the core regions of the plies and uniformly distributed in each of the core regions, the additional constituent is different from a conversion material for a change in wavelength of the radiation generated by the optoelectronic semiconductor chip during operation.

2. The method according to claim 1, wherein the conversion means is applied to the optoelectronic semiconductor chip in succession in a plurality of successive plies, wherein, after at least one of the plies has been applied, a color location of the radiation emitted by the optoelectronic semiconductor chip together with the conversion means already applied to the optoelectronic semiconductor chip is determined and, depending upon the color location, further plies of the conversion means are applied to the optoelectronic semiconductor chip.

3. The method according to claim 1, wherein, on release of the conversion means, a release material of a release layer enters at least partly into a gaseous phase as a result of the laser radiation, and the release material is deposited at least partly on the conversion means on the optoelectronic semiconductor chip or becomes embedded in the conversion means on the optoelectronic semiconductor chip.

4. The method according to claim 1, wherein the laser radiation has a wavelength of at most 410 nm, and the release layer, the conversion means or at least the additional constituent of the conversion means exhibits absorption at the wavelength of the laser radiation.

5. The method according to claim 1, wherein the release layer comprises a plastics or consists thereof, and a thickness of the release layer is 10 nm to 75 nm and an optical density of the release layer for the laser radiation is at least 0.5.

6. The method according to claim 1, wherein a region irradiated by the laser radiation seen in plan view onto the main carrier face, is linear in shape and the conversion means is applied line by line to the main radiation face.

7. An optoelectronic component comprising:
an optoelectronic semiconductor chip having a main radiation face,
a conversion means applied to the main radiation face in at least two successive and at least partially overlapping plies of the same kind, and
an additional constituent in the conversion means, which does not absorb a radiation generated during operation of the optoelectronic semiconductor chip,
wherein, in a direction away from the main radiation face, a concentration of the additional constituent in boundary regions of two adjacent plies is in each case different in comparison with core regions of the plies, and
the additional constituent is present at least in the core regions of the plies and uniformly distributed in each of the core regions, the additional constituent is different from a conversion material for a change in wavelength of the radiation generated by the optoelectric semiconductor chip during operation.

8. The optoelectronic component according to claim 7, wherein the individual plies have a thickness of 1 μm to 10 μm and a thickness of the conversion means is in total 15 μm to 200 μm.

9. The optoelectronic component according to claim 7, wherein the boundary regions have a thickness of 10 nm to 250 nm.

10. The optoelectronic component according to claim 7, wherein the additional constituent has in the boundary regions an average concentration increased relative to the core regions.

11. The optoelectronic component according to claim 7, wherein, in a lateral direction and in a direction perpendicular to the main radiation face, at least two of the plies follow one another and overlap one another, at least one of the plies having a convex boundary face facing away from the main radiation face.

12. The optoelectronic component according to claim 7, wherein the additional constituent is Zn or ZnO.

* * * * *